United States Patent
Toyoda (10) Patent No.: US 10,212,869 B2
(45) Date of Patent: Feb. 19, 2019

(54) METHOD OF MANUFACTURING PRINTED CIRCUIT BOARD AND METHOD OF INSPECTING PRINTED CIRCUIT BOARD

(71) Applicant: Nitto Denko Corporation, Ibaraki-shi, Osaka (JP)

(72) Inventor: Yoshihiro Toyoda, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 338 days.

(21) Appl. No.: 15/057,771

(22) Filed: Mar. 1, 2016

(65) Prior Publication Data

US 2016/0270274 A1    Sep. 15, 2016

(30) Foreign Application Priority Data

Mar. 12, 2015  (JP) .................................. 2015-049789

(51) Int. Cl.
| | | |
|---|---|---|
| *H05K 13/08* | (2006.01) | |
| *G06T 7/00* | (2017.01) | |
| *H05K 3/00* | (2006.01) | |

(52) U.S. Cl.
CPC ........... *H05K 13/08* (2013.01); *G06T 7/0004* (2013.01); *G06T 7/0008* (2013.01); *H05K 3/00* (2013.01);
(Continued)

(58) Field of Classification Search
CPC .................. H05K 1/0269; H05K 13/08; H05K 2203/163; Y10T 29/49009;
(Continued)

(56) References Cited

U.S. PATENT DOCUMENTS

| | | |
|---|---|---|
| 6,661,912 B1 | 12/2003 | Taguchi et al. |
| 2004/0047500 A1 | 3/2004 | Taguchi et al. |

(Continued)

FOREIGN PATENT DOCUMENTS

| | | |
|---|---|---|
| JP | H07307599 A | 11/1995 |
| JP | H11051622 A | 2/1999 |

(Continued)

OTHER PUBLICATIONS

Office Action dated Nov. 6, 2018 in JP Application No. 2015-049789.

*Primary Examiner* — Peter DungBa Vo
*Assistant Examiner* — Joshua D Anderson
(74) *Attorney, Agent, or Firm* — Panitch Schwarze Belisario & Nadel LLP (57) ABSTRACT

A printed circuit board is fabricated in a manufacturing process. In an inspection process, first and second light sources of an inspection device irradiate the printed circuit board with first and second light having first and second wavelength distributions. First and second imaging devices produce a monochromatic first image and a color second image of an inspection subject region of the printed circuit board based on the first and second light respectively reflected by the printed circuit board. Presence and absence of a defect is determined based on at least the first image by automatic optical inspection. Further, verification of the defect is performed by visual observation of at least the second image.

11 Claims, 6 Drawing Sheets

(52) U.S. Cl.
CPC .............. *G06T 2207/30141* (2013.01); *Y10T 29/49131* (2015.01); *Y10T 29/53087* (2015.01)

(58) Field of Classification Search
CPC ......... Y10T 29/49117; Y10T 29/49124; Y10T 29/49131; Y10T 29/49133; Y10T 29/49155; Y10T 29/49769; Y10T 29/53022; Y10T 29/53087; G06T 7/0002; G06T 7/0004; G06T 7/0008; G06T 2207/10152; G06T 2207/30141; G01N 21/25; G01N 21/255; G01N 21/256; G01N 21/29; G01N 21/33; G01N 21/35; G01N 21/3581; G01N 21/359; G01N 21/88; G01N 21/8803; G01N 21/8806; G01N 21/896; G01N 21/956; G01N 21/95607; G01N 21/95684; G01N 2021/1736; G01N 2021/1753; G01N 2021/8461; G01N 2021/8854; G01N 2021/8809; G01N 2021/8816; G01N 2021/8835; G01N 2021/8845; G01N 2021/8962; G01N 2021/8965; G01N 2021/8967; G01N 2021/95638; G01N 2021/95646; G01N 2021/95653; G01N 2021/95661

See application file for complete search history.

(56) References Cited

U.S. PATENT DOCUMENTS

| | | | |
|---|---|---|---|
| 2008/0197170 A1* | 8/2008 | Prince | G01N 21/8806 228/103 |
| 2009/0114426 A1* | 5/2009 | Tsunekawa | G01N 21/95684 174/250 |
| 2012/0055697 A1 | 3/2012 | Okamoto | |
| 2013/0044208 A1* | 2/2013 | Cherbis | G06K 9/209 348/125 |
| 2013/0155191 A1* | 6/2013 | Ishigaki | G01B 11/2509 348/46 |
| 2015/0040379 A1 | 2/2015 | Okamoto | |

FOREIGN PATENT DOCUMENTS

| | | |
|---|---|---|
| JP | 2009-117572 A | 5/2009 |
| JP | 2010129696 A | 6/2010 |
| JP | 2010217169 A | 9/2010 |
| JP | 2012059756 A | 3/2012 |

\* cited by examiner

METHOD OF MANUFACTURING PRINTED CIRCUIT BOARD AND METHOD OF INSPECTING PRINTED CIRCUIT BOARD

BACKGROUND OF THE INVENTION

Field of the Invention

The present invention relates to a method of manufacturing a printed circuit board and a method of inspecting the printed circuit board.

Description of Related Art

Conventionally, during manufacture of a printed circuit board, automatic optical inspection (AOI) for detecting a defect of wiring traces is performed. After the AOI, verification of a result of inspection is performed by an operator.

Generally, in the automatic optical inspection, a monochromatic light source is used, and the printed circuit board is irradiated with light having a specific wavelength, and a monochromatic image of the printed circuit board is acquired by a monochromatic camera. A defect of the printed circuit board is determined based on the acquired monochromatic image. Thereafter, in a verification step, a color image of a portion, which is determined to be defective by the automatic optical inspection, is acquired by a color camera. The operator verifies the defect based on the color image (JP 2012-549756 A etc.)

BRIEF SUMMARY OF THE INVENTION

In the inspection by the conventional method of manufacturing the printed circuit board, it is necessary to acquire a monochromatic image during the AOI and acquire a color image in the verification step. Therefore, a time period required for the inspection is lengthened. In recent years, it is required to shorten a time period required for the inspection in order to reduce a manufacturing cost.

An object of the present invention is to provide a method of manufacturing a printed circuit board and a method of inspecting the printed circuit board capable of shortening a time period required for inspection.

(1) According to one aspect of the present invention, a method of manufacturing a printed circuit board includes the steps of fabricating the printed circuit board, producing an image of an inspection subject region of the printed circuit board as a first image by a first imaging device, and producing an image of the inspection subject region of the printed circuit board as a second image by a second imaging device, determining presence and absence of a defect of the printed circuit board based on at least the first image, and determining presence and absence of a defect of the printed circuit board based on at least the second image, wherein the first imaging device produces the first image by receiving first light having a first wavelength distribution, and the second imaging device produces the second image by receiving second light having a second wavelength distribution at least partially different from the first wavelength region.

In this manufacturing method, the first image is produced based on the first light having the first wavelength distribution, and the second image is produced based on the second light having the second wavelength distribution. Thus, the first and second images show states of portions different from each other in a thickness direction of the printed circuit board. The presence and absence of the defect is determined based on the first image, and the presence and absence of the defect is determined based on the second image. The first and second images of the inspection subject region of the printed circuit board are simultaneously produced by the first and second imaging devices. Therefore, a time period required for inspection of the printed circuit board can be shortened.

(2) The step of determining the presence and absence of the defect of the printed circuit board based on the at least the first image may include determining presence and absence of a defect of the printed circuit board by automatic optical inspection based on at least the first image, and the step of determining the presence and absence of the defect of the printed circuit board based on the at least the second image may include determining presence and absence of a defect of the printed circuit board by visual observation based on at least the second image.

In this case, the presence and absence of the defect is determined by the automatic optical inspection based on the first image, and the presence and absence of the defect is determined by visual observation of the second image. Thus, the defect detected by the automatic optical inspection can be visually verified.

(3) The step of determining the presence and absence of the defect based on the at least the first image may include determining presence and absence of the defect based on the first image and the second image.

In this case, the first and second images show the states of the portions different from each other in the thickness direction of the printed circuit board, so that the presence and absence of the defect of the printed circuit board can be determined based on the first and second images with high accuracy. Further, a defect that cannot be detected only from the first image can be detected.

(4) The step of determining the presence and absence of the defect of the printed circuit board based on the at least the second image may include determining presence and absence of the defect of the printed circuit board based on the first image and the second image.

In this case, the first and second images show the states of the portions different from each other in the thickness direction of the printed circuit board, so that the presence and absence of the defect of the printed circuit board can be determined based on the first and second images with high accuracy. Further, a defect that cannot be detected from only the second image can be detected.

(5) The first light may be monochromatic light having a peak wavelength in a specific wavelength region, and the second light may be white light, the first imaging device may produce a monochromatic image as the first image by receiving the first light, and the second imaging device may produce a color image as the second image by receiving the second light.

In this case, the monochromatic image mainly shows a state of the inside of the printed circuit board, and the color image mainly shows a state of the surface of the printed circuit board. Thus, presence and absence of a defect of the inside of the printed circuit board can be mainly determined. Further, the detected defect of the inside can be verified mainly based on the state of the surface of the printed circuit board. Further, a defect of the surface of the printed circuit board can be detected.

(6) The step of producing the first and second images may further include irradiating the inspection subject region with the first light generated by a first light source, and irradiating the inspection subject region with the second light generated by a second light source, and the first imaging device may be provided to receive the first light from the printed circuit board, and the second imaging device may be provided to receive the second light from the printed circuit board.

In this case, the first imaging device receives the first light from the inspection subject region, and the second imaging device receives the second light from the inspection subject region. Thus, light other than the first and second light is not incident on the respective first and second imaging devices. Therefore, flexibility of selection of types of the first and second imaging devices is large.

(7) The first imaging device may be provided to receive the first light reflected by the printed circuit board, and the second imaging device may be provided to receive the second light reflected by the printed circuit board.

In this case, the first imaging device and the first light source can be arranged on the same side with respect to the printed circuit board. Further, the second imaging device and the second light source can be arranged on the same side with respect to the printed circuit board. Therefore, it is possible to produce the first and second images without complicating an arrangement of the first and second imaging devices, and the first and second light sources.

(8) The step of producing the first and second images may further include relatively moving the first and second imaging devices and the printed circuit board in a first direction, the first imaging device may include a first line camera arranged to image a line region extending in a second direction that intersects with the first direction in the printed circuit board, and the second imaging device may include a second line camera arranged to image the line region extending in the second direction in the printed circuit board.

In this case, it is possible to respectively produce the first and second images of the large inspection subject region without increasing the size of each of the first and second imaging devices.

(9) The first and second line cameras may be provided in parallel to each other, and configured to simultaneously move in the first direction while imaging the line region extending in the second direction.

In this case, the first and second images of the same region of the printed circuit board can be acquired in a short period of time. Thus, a time period required for the inspection of the printed circuit board can be more sufficiently shortened.

(10) The first wavelength distribution may be defined such that the first image shows a state of inside of the printed circuit board, and the second wavelength distribution may be defined such that the second image shows a state of a surface of the printed circuit board.

In this case, presence and absence of a defect of the inside of the printed circuit board can be determined based on the first image. Further, the detected defect of the inside can be verified mainly based on the state of the surface of the printed circuit board. Further, the defect of the surface of the printed circuit board can be detected based on the second image.

(11) According to another aspect of the present invention, a method of inspecting a printed circuit board includes the steps of producing an image of an inspection subject region of the printed circuit board as a first image by a first imaging device, and producing an image of the inspection subject region of the printed circuit board as a second image by a second imaging device, determining presence and absence of a defect of the printed circuit board based on at least the first image, and determining presence and absence of a defect of the printed circuit board based on at least the second image, wherein the first imaging device produces the first image by receiving first light having a first wavelength distribution, and the second imaging device produces the second image by receiving second light having a second wavelength distribution at least partially different from the first wavelength region.

In the inspection method, the first image is produced based on the first light having the first wavelength distribution, and the second image is produced based on the second light having the second wavelength distribution. Thus, the first and second images show the states of portions different from each other in the thickness direction of the printed circuit board. The presence and absence of the defect is determined based on the first image, and the presence and absence of the defect is determined based on the second image. The first and second images of the inspection subject region of the printed circuit board are simultaneously produced by the first and second imaging devices by the above-mentioned method. Therefore, a time period required for the inspection of the printed circuit board can be shortened.

(12) The step of determining the presence and absence of the defect of the printed circuit board based on the at least the first image may include determining presence and absence of a defect of the printed circuit board by automatic optical inspection based on at least the first image, and the step of determining the presence and absence of the defect of the printed circuit board based on the at least the second image may include determining presence and absence of a defect of the printed circuit board by visual observation based on at least the second image.

In this case, the presence and absence of the defect is determined by the automatic optical inspection based on the first image, and the presence and absence of the defect is determined by visual observation of the second image. Thus, the defect detected by the automatic optical inspection can be visually verified.

Other features, elements, characteristics, and advantages of the present invention will become more apparent from the following description of preferred embodiments of the present invention with reference to the attached drawings.

DESCRIPTION OF THE PREFERRED EMBODIMENTS

A method of manufacturing a printed circuit board and a method of inspecting the printed circuit board according to embodiments of the present invention will be described below with reference to drawings. The method of manufacturing the printed circuit board includes steps of manufacturing the printed circuit board and steps of inspecting the printed circuit board. The printed circuit board is a suspension board having a circuit, for example.

(1) Manufacturing Process of Printed Circuit Board

Figure 1A:
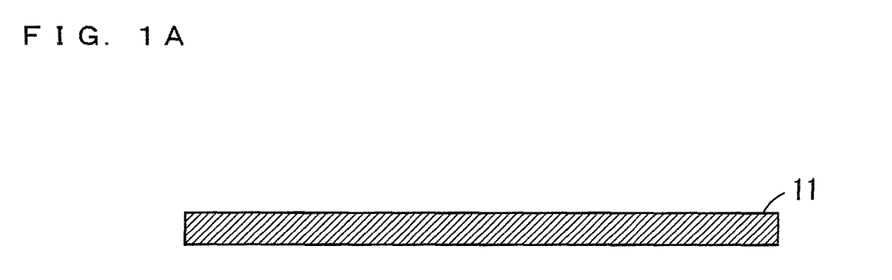
FIGS. 1A to 1D are cross sectional views showing one example of a manufacturing process of a printed circuit board according to the present embodiment.

FIGS. 1A to 1D are cross sectional views showing one example of the manufacturing process of the printed circuit board according to the present embodiment. First, as shown in FIG. 1A, an elongated metal support substrate 11 made of stainless, for example, is prepared. While the manufacturing process of the one printed circuit board is shown in FIGS. 1A to 1D, the plurality of printed circuit boards are formed on the elongated metal support substrate 11 by a roll-to-roll system in the present embodiment. The thickness of the metal support substrate 11 is not less than 5 μm and not more than 50 μm, for example, and is preferably not less than 10 μm and not more than 30 μm.

Figure 1B:
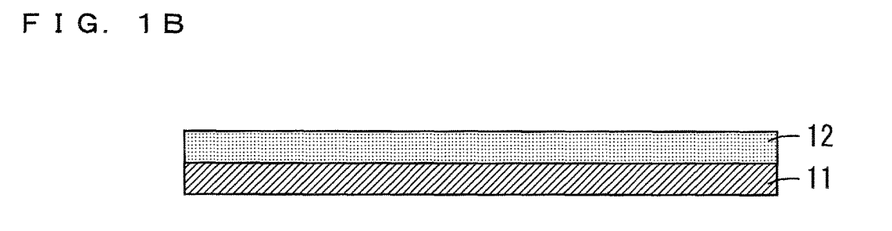

Next, as shown in FIG. 1B, a base insulating layer 12 made of polyimide, for example, is formed on the metal support substrate 11. The thickness of the base insulating layer 12 is not less than 1 μm and not more than 30 μm, for example, and is preferably not less than 3 μm and not more than 20 μm.

Figure 1C:
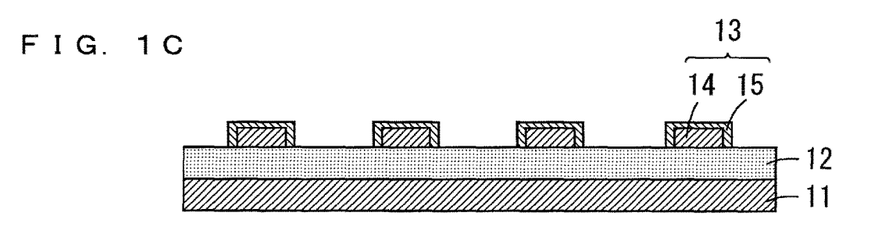

Then, as shown in FIG. 1C, a plurality of wiring traces 13 are formed on the base insulating layer 12. In the present embodiment, each of wiring traces 13 is constituted by conductor traces 14 made of copper, for example, and metal cover layers 15 made of nickel, for example. The thickness of the wiring traces 13 is not less than 3 μm and not more than 30 μm, for example, and preferably not less than 5 μm and not more than 20 μm. Each wiring trace 13 includes a line wiring layer and terminal portions such as pads provided at both ends of the wiring layer, for example. The wiring trace 13 may be a grounding conductor layer. Each conductor trace 14 may be formed using a semi-additive method, for example, or may be formed using another method such as a subtractive method. The metal cover layer 15 is formed to cover a surface of the conductor trace 14 by electroless plating, for example. The thickness of the metal cover layers 15 is not more than 2 μm, for example, and is preferably not less than 0.1 μm and not more than 1 μm.

Figure 1D:
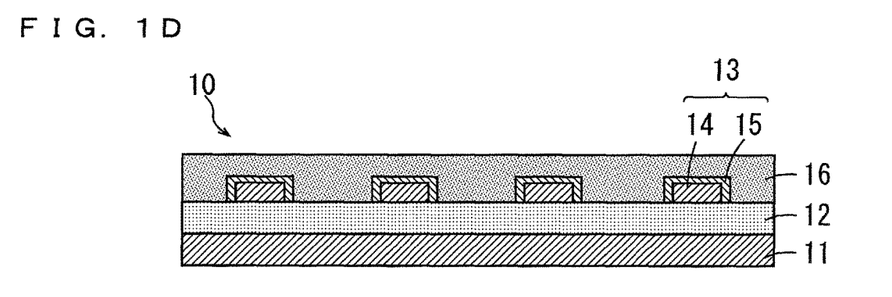

As shown in FIG. 1D, a cover insulating layer 16 made of polyimide, for example, is formed on the base insulating layer 12 to cover the plurality of wiring traces 13. In this case, openings are provided at the cover insulating layer 16 such that each terminal portion of each wiring trace 13 is exposed. The thickness of the cover insulating layer 16 is not less than 3 μm and not more than 30 μm, for example, and is preferably not less than 5 μm and not more than 20 μm.

(2) Inspection Device for Printed Circuit Board

An elongated board assembly sheet having the plurality of printed circuit boards 10 is fabricated by the steps of the above-mentioned FIGS. 1A to 1D. Next, inspection of each printed circuit board 10 of the board assembly sheet is performed.

Figure 2:
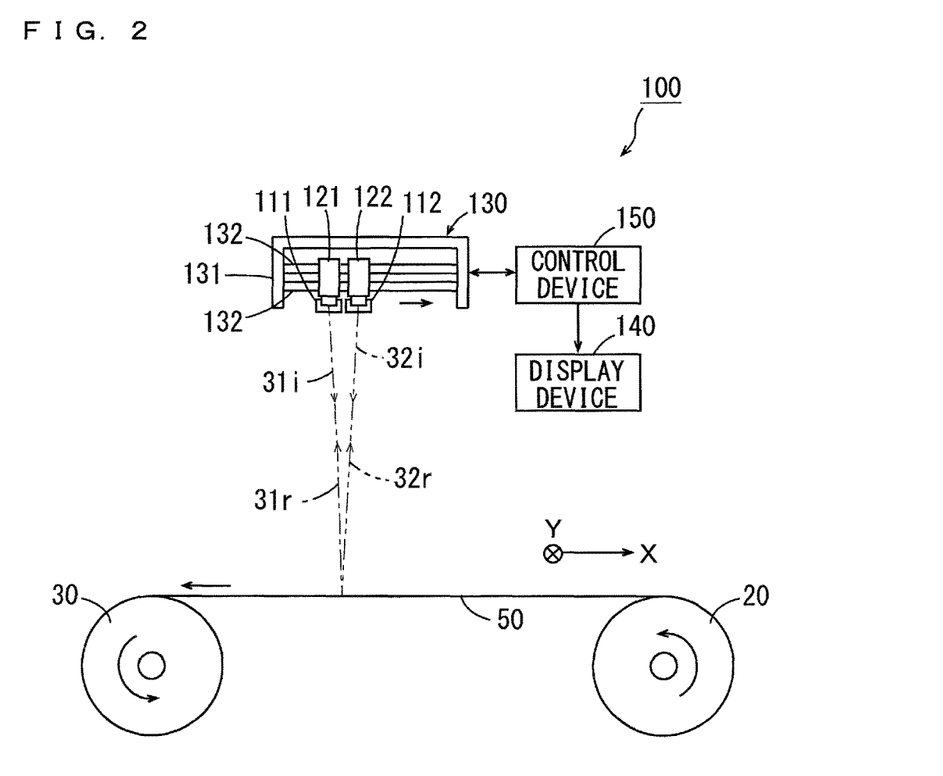
FIG. 2 is a schematic diagram showing an inspection device for inspecting the printed circuit board of a board assembly sheet transported by a roll-to-roll system.

FIG. 2 is a schematic diagram showing the inspection device for inspecting the printed circuit boards of the board assembly sheet transported by the roll-to-roll system.

As shown in FIG. 2, a feed roll 20 and a wind-up roll 30 are arranged at a distance to be rotatable in a direction of arrows. The board assembly sheet 50 fed from the feed roll 20 is transported in a direction of an arrow and is wound by the wind-up roll 30.

The inspection device 100 includes a first light source 111, a second light source 112, a first imaging device 121, a second imaging device 122, a driving device 130, a display device 140 and a control device 150.

Hereinafter, a direction parallel to a surface of the transported board assembly sheet 50 is referred to as a first direction X, and a direction that is parallel to the surface of the board assembly sheet 50 and intersects with the first direction X is referred to as a second direction Y. In the present embodiment, the first direction X and the second direction Y are orthogonal to each other.

The driving device 130 is arranged above the transported board assembly sheet 50. This driving device 130 includes a support member 131 and a guide member 132. The guide member 132 is provided at the support member 131 to extend in the first direction X. The first imaging device 121 and the second imaging device 122 are provided in parallel to each other to be arranged in the first direction X by the guide member 132. Further, the first light source 111 and the second light source 112 are arranged in parallel to each other to be arranged in the first direction X by the guide member 132. The first light source 111, the second light source 112, the first imaging device 121 and the second imaging device 122 are configured to be integrally and simultaneously movable in the first direction X along the guide member 132.

The first light source 111 emits first light having a first wavelength distribution. In the present embodiment, the first light source 111 is a monochromatic light source that generates monochromatic light. The first light has a peak wavelength in a wavelength region from 400 nm to 500 nm or a wavelength from 630 nm to 850 nm, for example. As the first light source 111, a plurality of light-emitting diodes that emit violet light or blue light may be used, or a plurality of light-emitting diodes that emit red light or infrared-light may be used, for example. The second light source 112 emits second light having a second wavelength distribution. In the present embodiment, the second light source 112 is a white light source that generates white light, for example. The second light has a wavelength component ranging from 380 nm to 780 nm, for example. As the second light source 112, a plurality of light-emitting diodes that emit white light are used. The first light source 111 and the second light source 112 are turned on when the first imaging device 121 and the second imaging device 122 are operated.

In the present embodiment, the first imaging device 121 is a monochromatic line camera that uses a monochromatic line sensor such as a one dimensional CCD (Charge-Coupled Device), and has a plurality of linearly arranged pixels. The number of pixels of the first imaging device 121 is 16,384 for example, and a pixel size is 5 μm×5 μm, for example. The first imaging device 121 is arranged such that the plurality of pixels are arranged in the second direction Y. Further, in the present embodiment, the second imaging device 122 is a color line camera using a color line sensor such as the one dimensional CCD, and has a plurality of pixels linearly arranged in four rows. The number of pixels of the second imaging device 122 is 4×16384, for example, and a pixel size is 5 μm×5 μm, for example. The second imaging device 122 is arranged such that the plurality of pixels in each row are arranged in the second direction Y.

The control device 150 is constituted by a CPU (Central Control Processing Unit) and a semiconductor memory, for example. This control device 150 controls operations of the feed roll 20, the wind-up roll 30, the first light source 111, the second light source 112, the first imaging device 121, the second imaging device 122, the driving device 130 and the display device 140, and functions as a determinator that performs automatic optical inspection based on a first image and a second image, described below.

The first light source 111 emits the first light as incident light 31*i* towards the board assembly sheet 50. Thus, the incident light 31*i* is incident on the surface of the board assembly sheet 50. Reflected light 31*r* from the board assembly sheet 50 is incident on the first imaging device 121. The second light source 112 emits the second light as the incident light 32*i* towards the board assembly sheet 50. Thus, the incident light 32*i* is incident on the surface of the board assembly sheet 50. The reflected light 32*r* from the board assembly sheet 50 is incident on the second imaging device 122.

Figure 3:
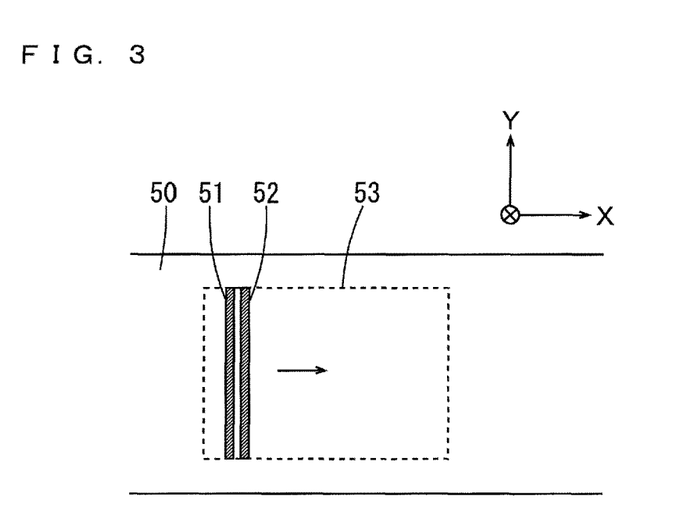
FIG. 3 is a schematic plan view of the board assembly sheet in an inspection process.

FIG. 3 is a schematic plan view of the board assembly sheet 50 in the inspection process. In the inspection process, the board assembly sheet 50 is temporarily stopped. In this state, on the board assembly sheet 50 of FIG. 3, a linear first imaging region 51 that can be imaged by the first imaging device 121 of FIG. 2 is set, and a linear second imaging region 52 that can be imaged by the second imaging device 122 is set. The first imaging region 51 and the second imaging region 52 extend in the second direction Y. The first imaging region 51 and the second imaging region 52 are close to each other in the first direction X. The first imaging region 51 is irradiated with the first light by the first light source 111, and the second imaging region 52 is irradiated with the second light by the second light source 112. The first light and the second light have linear cross sections that extend in the second direction Y. The first imaging device 121 receives reflected light from the first imaging region 51, and the second imaging device 122 receives reflected light from the second imaging region 52.

In this state, the first light source 111, the second light source 112, the first imaging device 121 and the second imaging device 122 are simultaneously moved in the first direction X by the driving device 130. Thus, the first and second imaging regions 51, 52 on the board assembly sheet 50 are moved in the first direction X by a constant distance. In this case, a rectangular region of the board assembly sheet 50 is scanned by the respective first and second light having linear cross sections, and imaged by the first and second imaging devices 121, 122. The rectangular region scanned by the first and second light is referred to as an inspection subject region (a region to be inspected) 53. In the present embodiment, the inspection subject region 53 includes a plurality of printed circuit boards 10.

As a result of the above-mentioned operation, a monochromatic image of the inspection subject region 53 of the board assembly sheet 50 is acquired by the first imaging device 121, and a color image of the inspection subject region 53 of the board assembly sheet 50 is acquired by the second imaging device 122. Hereinafter, the monochromatic image acquired by the first imaging device 121 is referred to as a first image, and the color image acquired by the second imaging device 122 is referred to as a second image.

In the present embodiment, the control device 150 controls the first light source 111, the second light source 112, the first imaging device 121, the second imaging device 122 and the driving device 130 such that the first and second images of the same inspection subject region 53 of the board assembly sheet 50 are acquired.

The cover insulating layer 16 of the printed circuit board 10 of FIGS. 1A to 1D transmits a large part of the first light, and the large part of the first light is reflected by the wiring traces 13. Part of the first light is reflected by a surface of the cover insulating layer 16 on the wiring traces 13. Therefore, in the first image, a state of the wring traces 13 in the printed circuit board 10 is mainly clearly shown, and a state of the surface of the printed circuit board 10 is lightly shown. On the one hand, a large part of the second light is reflected by the surface of the cover insulating layer 16 on the wiring traces 13. The cover insulating layer 16 of the printed circuit board 10 transmits part of the second light, and the part of the second light is reflected by the wiring traces 13. Therefore, in the second image, a state of the surface (an appearance) of the printed circuit board 10 is mainly clearly shown, and a state of the wiring traces 13 in the printed circuit board 10 is lightly shown.

Figure 4A:
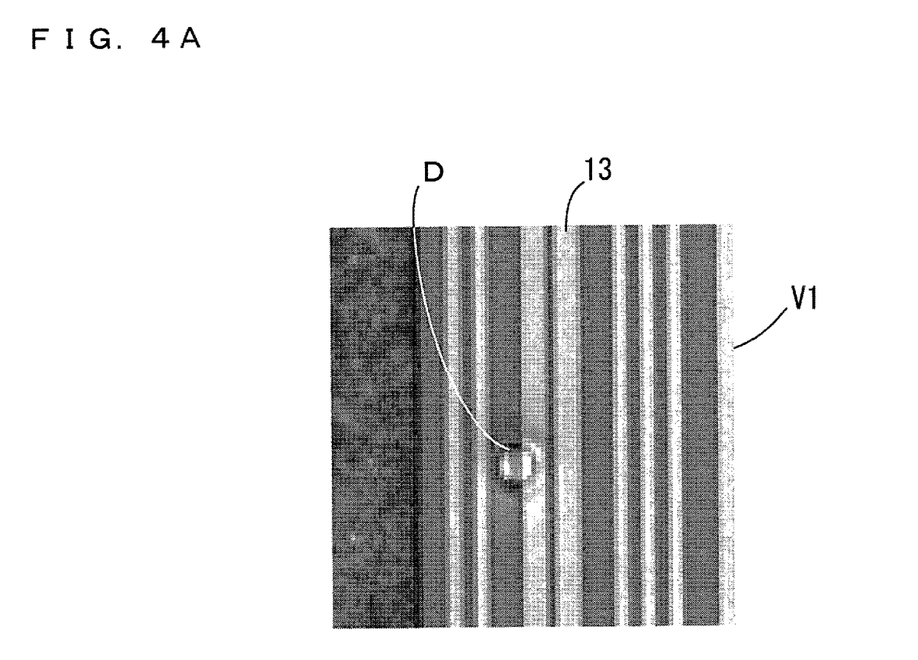
FIGS. 4A and 4B are diagrams showing one example of a first image and a second image respectively acquired by a first imaging device and a second imaging device.
Figure 4B:
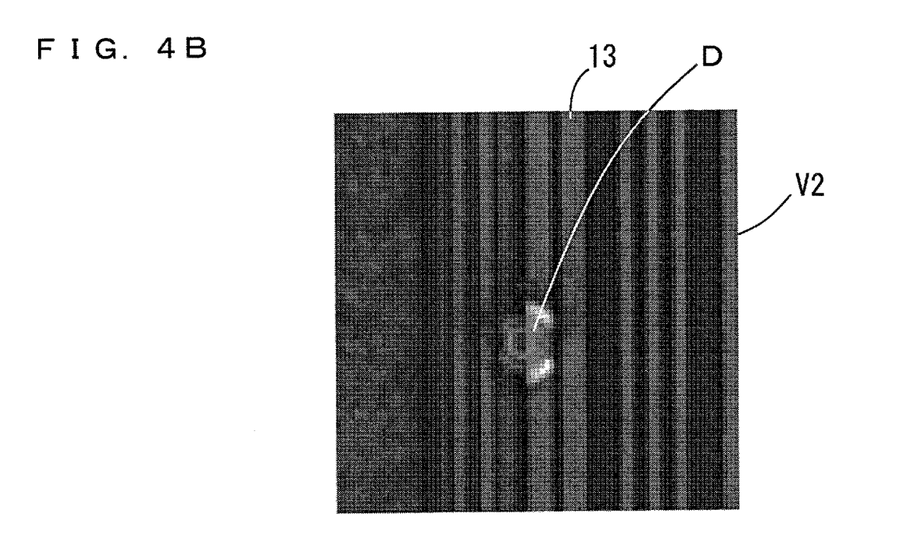
Figure 5A:
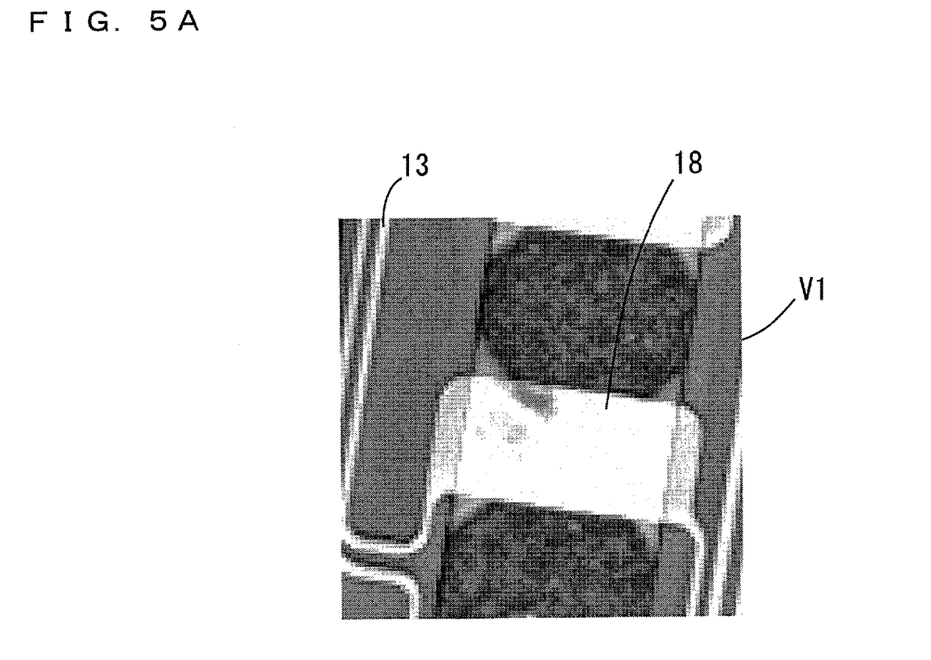
FIGS. 5A and 5B are diagrams showing other examples of the first image and the second image respectively acquired by the first imaging device and the second imaging device.
Figure 5B:
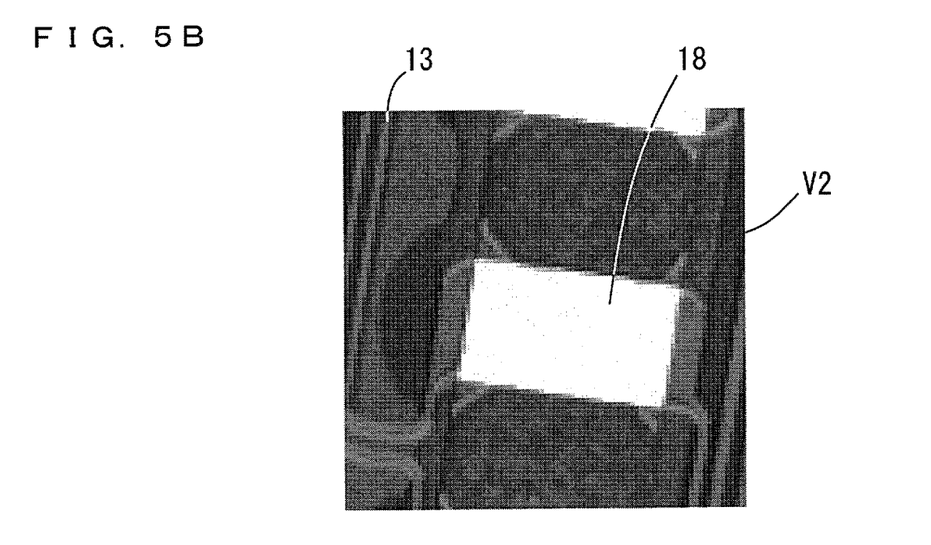

FIGS. 4A and 4B are diagrams showing one example of the first image and the second image respectively acquired by the first imaging device 121 and the second imaging device 122. FIGS. 5A and 5B are diagrams showing another example of the first image and the second image respectively acquired by the first imaging device 121 and the second imaging device 122. FIGS. 4A and 4B and FIGS. 5A and 5B show part of the first and second images.

In the example of the first image of FIG. 4A, the wiring traces 13 are clearly shown, and a defect D is also shown. In the example of the second image of FIG. 4B, the wiring traces 13 are lightly shown, and the defect D is also shown.

In the example of the first image of FIG. 5A, the wiring traces are clearly shown, and a pad 18 exposed on the surface of the printed circuit board 10 is also shown. In the example of the second image of FIG. 5B, the pad 18 exposed on the surface of the printed circuit board 10 is clearly shown, and the wiring traces 13 are lightly shown.

In this manner, the first and second light respectively have first and second wavelength distributions different from each other, so that the first and second images show states of portions different from each other in a thickness direction of the printed circuit board 10. In the present embodiment, the first image mainly shows a state of the inside of the wiring traces 13 of the printed circuit board 10, and the second image mainly shows a state of the surface of the printed circuit board 10.

(3) Inspecting Process of Printed Circuit Board

Figure 6:
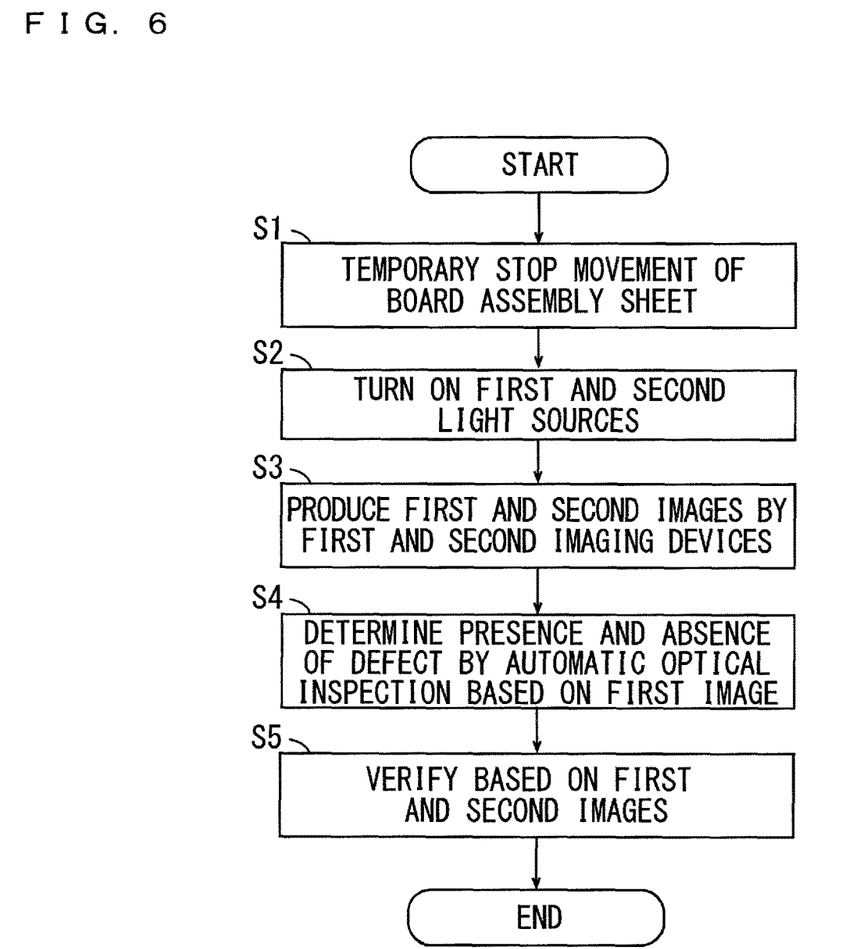
FIG. 6 is a flow chart showing inspecting process of the printed circuit board according to the present embodiment.

FIG. 6 is a flow chart showing the inspecting process of the printed circuit board 10 according to the present embodiment.

First, the control device 150 of FIG. 2 temporarily stops the movement of the board assembly sheet 50 by stopping the rotation of each of the feed roll 20 and the wind-up roll 30 (step S1). In this state, the control device 150 turns on the first light source 111 and the second light source 112 (step S2). Further, the control device 150 controls the driving device 130 such that the first light source 111, the second light source 112, the first imaging device 121 and the second imaging device 122 are moved in the first direction X. At this time, the first imaging device 121 and the second imaging device 122 respectively produce the first image and the second image (step S3). As described above, in the present embodiment, a monochromatic image and a color image of the same inspection subject region 53 of the board assembly sheet 50 are acquired as the first and second images.

Next, the control device 150 determines presence and absence of a defect by the automatic optical inspection based on the first image and the second image (step S4). Thereafter, the control device 150 arranges and displays the first image and the second image on the screen of the display device 140. An operator verifies a defect by visually observing the first and second images including the defect detected in the automatic optical inspection (step S5).

Figure 7:
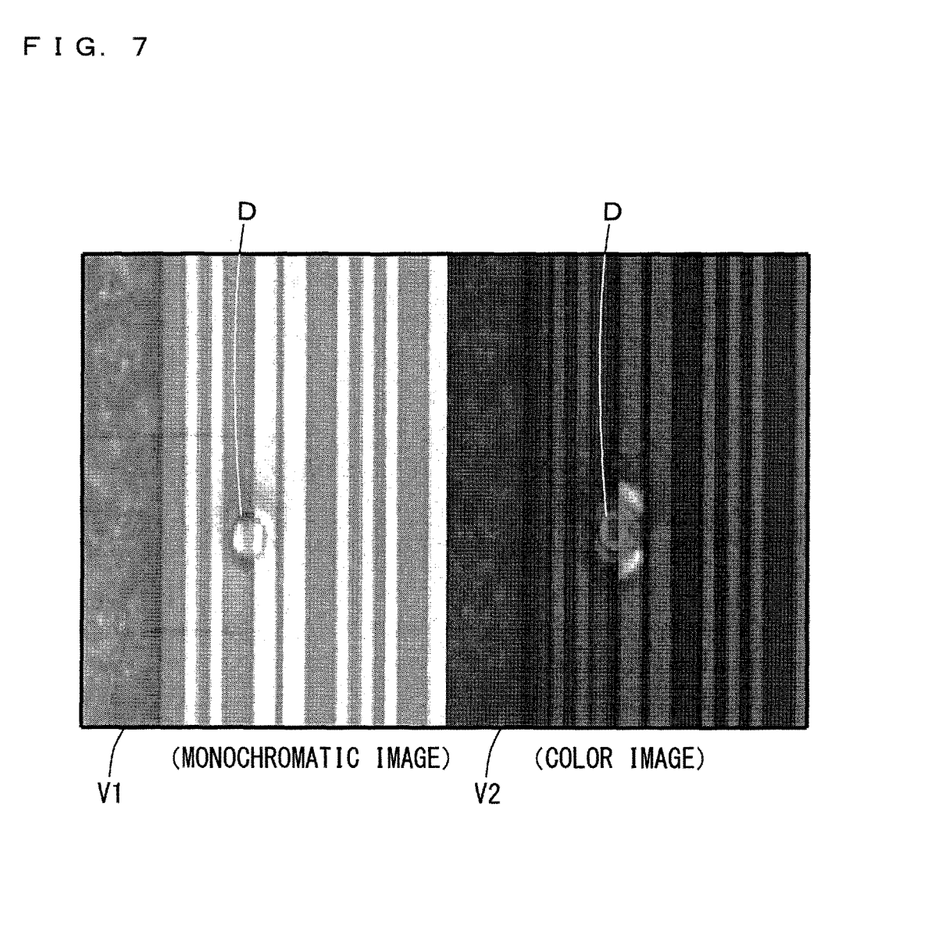
FIG. 7 is a diagram showing an example of the first and second images shown on a screen.

FIG. 7 is a diagram showing an example of the first and second images shown on the screen. As shown in FIG. 7, the monochromatic first image V1 and the color second image V2 are arranged and displayed on the screen. In the example of FIG. 7, the defect D is shown on both of the first image V1 and the second image V2. In this case, it is considered that the defect D is caused by contamination.

When it is confirmed that a defect is present in the printed circuit board by the automatic optical inspection and visual observation, it is determined that the printed circuit board is defective. On the one hand, when it is confirmed that a defect is absent from the printed circuit board by the automatic optical inspection and the visual observation, it is determined that the printed circuit board is non-defective.

(4) Effects of Embodiment

In the manufacturing method according to the present embodiment, the first image showing the state of the inside of the printed circuit board 10 and the second image showing the state of the surface of the printed circuit board 10 are simultaneously acquired in the inspection process. Therefore, a time period required for the inspection of the printed circuit board 10 can be shortened.

Further, the automatic optical inspection can be performed based on the monochromatic first image showing the state of the inside of the printed circuit board 10, and the color second image showing the state of the surface of the printed circuit board 10, whereby the presence and absence of a defect of the printed circuit board 10 can be determined with high accuracy. Further, a defect that is not detected from only the first image can be detected.

Further, it is possible to verify the defect with high accuracy by visually observing the monochromatic first image showing the state of the inside of the printed circuit board 10, and the color second image showing the state of the surface of the printed circuit board 10. Further, the defect at the surface of the printed circuit board 10 can be visually detected.

Further, a monochromatic light source is used as the first light source 111, and a white light source is used as the second light source 112, so that monochromatic light is incident on the first imaging device 121, and white light is incident on the second imaging device 122. In this case, even when the color line camera is used as the first imaging device 121, a monochromatic image can be acquired by the first imaging device 121, for example. Therefore, flexibility of selection of types of the first imaging device 121 increases.

Further, the first light source 111, the second light source 112, the first imaging device 121, and the second imaging device 122 are arranged on the same side with respect to the printed circuit board 10. Thus, it is possible to simultaneously acquire the first and second images without complicating the arrangement of the first light source 111, the second light source 112, the first imaging device 121 and the second imaging device 122.

Further, the monochromatic line camera and the color line camera are respectively used as the first imaging device 121 and the second imaging device 122, so that it is possible to acquire the first and second images of the large inspection subject region 53 without increasing the size of each of the first imaging device 121 and the second imaging device 122.

Further, the first and second images are arranged and displayed, so that the operator can accurately verify the defect by comparing the first and second images to each other. Further, the operator can find a defect that is difficult to be detected by only one of the first and second images.

(5) Other Embodiments

While the first light source 111, the second light source 112, the first imaging device 121 and the second imaging device 122 are moved in order to acquire the first and second images in the above-mentioned embodiment, the board assembly sheet 50 may be moved with the first light source 111, the second light source 112, the first imaging device 121 and the second imaging device 122 being still.

While the line camera is used as each of the first imaging device 121 and the second imaging device 122 in the above-mentioned embodiment, an area camera using an area sensor such as a two-dimensional CCD may be used as each of the first imaging device 121 and the second imaging device 122. In this case, it is possible to acquire the first and second images without moving the first light source 111, the second light source 112, the first imaging device 121 and the second imaging device 122.

While the automatic optical inspection is performed based on the first and second images in the above-mentioned embodiment, the automatic optical inspection may be performed by only the first image. While verification of a defect is performed by visual observation of each of the first and second images in the above-mentioned embodiment, the defect may be verified by visual observation of only the second image.

While the first light is monochromatic light and the second light is white light in the above-mentioned embodiment, the first light and the second light may be monochromatic light having different wavelength distributions. For example, monochromatic light having a peak wavelength in a wavelength region from 400 nm to 500 nm may be used as the first light, and monochromatic light having a peak wavelength in a wavelength region from 630 nm to 850 nm may be used as the second light.

While a monochromatic light source that generates monochromatic light having a peak wavelength in the wavelength region from 400 nm to 500 nm or the wavelength region from 630 nm to 850 nm is used as the first light source 111 in the above-mentioned embodiment, the first light source 111 may selectively generate a plurality of types of light having peak wavelengths in different wavelength regions. For example, the first light source 111 may include a plurality of light emitting diodes that emit violet light or blue light and a plurality of light emitting diodes that emit red light or infrared light. In this case, the plurality of light-emitting diodes that emit violet light or blue light and the plurality of light-emitting diodes that emit red light or infrared light are selectively turned on according to a type of the printed circuit board 10.

While the light-emitting diodes are used as each of the first light source 111 and the second light source 112 in the above-mentioned embodiment, other light-emitting devices such as laser diodes may be used as each of the first light source 111 and the second light source 112.

The arrangement of the first and second light sources 111, 112 and the first and second imaging devices 121, 122 is not limited to the arrangement of the above-mentioned embodiment. The first and second light sources 111, 112 may be arranged such that the first and second imaging regions 51, 52 extend in the first direction X, and the first and second imaging devices 121, 122 may be arranged to receive reflected light from the first and second imaging regions 51, 52 extending in the first direction X. In this case, the first and second light sources 111, 112 and the first and second imaging devices 121, 122 are simultaneously moved in the second direction Y. Thus, the first and second imaging regions 51, 52 on the board assembly sheet 50 are moved in the second direction Y by a constant distance.

As a material for the metal support substrate 11, another metal or an alloy such as a 42 alloy, aluminum, copper-beryllium or phosphor bronze, or the like may be used instead of stainless. As a material for the base insulating layer 12, another synthetic resin such as polyamide imide, acryl, polyethersulfone, polyethylene terephthalate (PET), polyethylenenaphthalate, polyvinyl chloride, or epoxy may be used instead of polyimide.

As a material for the conductor traces 14, another metal such as gold (Au) or aluminum, or an alloy such as a copper alloy or an aluminum alloy may be used instead of copper. As a material for the metal cover layer 15, another metal such as tin or an alloy may be used instead of nickel.

As a material for the cover insulating layer 16, another synthetic resin such as polyamide imide, acryl, polyethersulfone, polyethylene terephthalate (PET), polyethylenenaphthalate, polyvinyl chloride, or epoxy may be used instead of polyimide.

The printed circuit board being a subject of the inspection is not limited to a suspension board having a circuit and may be another printed circuit board such as a flexible printed circuit board or a COF (Chip on Film) substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be utilized for manufacturing, inspecting or the like of printed circuit boards.

I claim:

1. A method of manufacturing a printed circuit board comprising the steps of:
    producing an image of an inspection subject region of the printed circuit board as a first image by a first imaging device and producing an image of the inspection subject region of the printed circuit board as a second image by a second imaging device by relatively moving the first and second imaging devices and the printed circuit board in a first direction, the first imaging device including a first line camera arranged to image a first line region extending in a second direction that intersects with the first direction in the printed circuit board and the second imaging device including a second line camera arranged to image a second line region close to the first line region and extending in the second direction in the printed circuit board;
    determining presence and absence of a defect of the printed circuit board based on at least the first image; and
    determining presence and absence of a defect of the printed circuit board based on at least the second image,
    wherein the first imaging device produces the first image by receiving first light irradiated onto the first line region and having a first wavelength distribution, and the second imaging device produces the second image by receiving second light irradiated onto the second line region and having a second wavelength distribution at least partially different from the first wavelength distribution, and
    wherein the first and second line cameras are provided in parallel to each other and are configured to simultaneously move in the first direction while imaging the first line region and the second line region respectively extending in the second direction as the first and second line regions are moved in the first direction and the first line region is irradiated with the first light and the second line region is irradiated with the second light to produce the first image and the second image respectively.

2. The method of manufacturing the printed circuit board according to claim 1, wherein
    the step of determining the presence and absence of the defect of the printed circuit board based on the at least the first image includes determining presence and absence of the defect of the printed circuit board by automatic optical inspection based on at least the first image, and
    the step of determining the presence and absence of the defect of the printed circuit board based on the at least the second image includes determining presence and absence of the defect of the printed circuit board by visual observation based on at least the second image.

3. The method of manufacturing the printed circuit board according to claim 1, wherein
    the step of determining the presence and absence of the defect based on the at least the first image includes determining presence and absence of the defect based on the first image and the second image.

4. The method of manufacturing the printed circuit board according to claim 1, wherein
    the step of determining the presence and absence of the defect of the printed circuit board based on the at least the second image includes determining presence and absence of the defect of the printed circuit board based on the first image and the second image.

5. The method of manufacturing the printed circuit board according to claim 1, wherein
    the first light is monochromatic light having a peak wavelength in a specific wavelength region, and the second light is white light,
    the first imaging device produces a monochromatic image as the first image by receiving the first light, and
    the second imaging device produces a color image as the second image by receiving the second light.

6. The method of manufacturing the printed circuit board according to claim 1, wherein
    the step of producing the first and second images further includes irradiating the inspection subject region with the first light generated by a first light source, and irradiating the inspection subject region with the second light generated by a second light source, and
    the first imaging device is provided to receive the first light from the printed circuit board, and the second imaging device is provided to receive the second light from the printed circuit board.

7. The method of manufacturing the printed circuit board according to claim 6, wherein
    the first imaging device is provided to receive the first light reflected by the printed circuit board, and the second imaging device is provided to receive the second light reflected by the printed circuit board.

8. The method of manufacturing the printed circuit board according to claim 1, wherein
the first wavelength distribution is defined such that the first image shows a state of inside of the printed circuit board, and the second wavelength distribution is defined such that the second image shows a state of a surface of the printed circuit board.

9. A method of inspecting a printed circuit board, including the steps of:
producing an image of an inspection subject region of the printed circuit board as a first image by a first imaging device and producing an image of the inspection subject region of the printed circuit board as a second image by a second imaging device by relatively moving the first and second imaging devices and the printed circuit board in a first direction, the first imaging device including a first line camera arranged to image a first line region extending in a second direction that intersects with the first direction in the printed circuit board and the second imaging device including a second line camera arranged to image a second line region close to the first line region and extending in the second direction in the printed circuit board;
determining presence and absence of a defect of the printed circuit board based on at least the first image; and
determining presence and absence of a defect of the printed circuit board based on at least the second image,
wherein the first imaging device produces the first image by receiving first light irradiated onto the first line region and having a first wavelength distribution, and the second imaging device produces the second image by receiving second light irradiated onto the second line region and having a second wavelength distribution at least partially different from the first wavelength distribution, and
wherein the first and second line cameras are provided in parallel to each other and are configured to simultaneously move in the first direction while imaging the first line region and the second line region respectively extending in the second direction as the first and second line regions are moved in the first direction and the first line region is irradiated with the first light and the second line region is irradiated with the second light to produce the first image and the second image respectively.

10. The method of inspecting the printed circuit board according to claim 9, wherein
the step of determining the presence and absence of the defect of the printed circuit board based on the at least the first image includes determining presence and absence of the defect of the printed circuit board by automatic optical inspection based on at least the first image, and
the step of determining the presence and absence of the defect of the printed circuit board based on the at least the second image includes determining presence and absence of the defect of the printed circuit board by visual observation based on at least the second image.

11. A method of manufacturing a printed circuit board comprising the steps of:
fabricating the printed circuit board;
moving the printed circuit board in a first direction;
moving first and second line cameras in the first direction while imaging a first line region of an inspection subject region of the printed circuit board by the first line camera and imaging a second line region different from the first line region of the inspection subject region of the printed circuit board by the second line camera such that the first line region imaged by the first line camera and the second line region imaged by the second line camera are moved along the first direction on the printed circuit board;
producing a first image from the imaging of the first line region while moving the first line camera in the first direction by receiving first light having a first wavelength distribution by the first line camera, and producing a second image from the imaging of the second line region while moving the second line camera in the first direction by receiving second light having a second wavelength distribution at least partially different from the first wavelength distribution by the second line camera;
determining presence and absence of a defect of the printed circuit board based on at least the first image; and
determining presence and absence of a defect of the printed circuit board based on at least the second image,
wherein the first and second line regions are orthogonal to the first direction.

* * * * *